United States Patent [19]
Hasegawa

[11] Patent Number: 5,708,434
[45] Date of Patent: Jan. 13, 1998

[54] RESISTOR STRING DIGITAL/ANALOG CONVERTER WITH RESETTING SWITCHES

[75] Inventor: Hiroshi Hasegawa, Tokyo, Japan

[73] Assignee: NEC Corporation, Tokyo, Japan

[21] Appl. No.: 706,535

[22] Filed: Sep. 5, 1996

[30] Foreign Application Priority Data

Sep. 6, 1995 [JP] Japan .................... 7-254724

[51] Int. Cl.$^6$ .................................................. H03M 1/76
[52] U.S. Cl. ........................... 341/148; 341/154; 341/150
[58] Field of Search ................................. 341/150, 154, 341/172, 148

[56] References Cited

U.S. PATENT DOCUMENTS

| | | | |
|---|---|---|---|
| 4,160,244 | 7/1979 | Solomon et al. | 341/148 |
| 4,354,175 | 10/1982 | Goldstein | 341/165 |
| 4,366,470 | 12/1982 | Takahashi et al. | 341/148 |
| 5,302,869 | 4/1994 | Hosotani et al. | 307/518 |
| 5,430,399 | 7/1995 | Wendell | 326/121 |
| 5,498,987 | 3/1996 | Nelson | 327/143 |

OTHER PUBLICATIONS

Malcolm R. Haskard et al., "Analog VLSI Design nMos and CMOS", Prentice Hall of Australia Pt Ltd, pp. 115–117, 1988.

R.S. Soin et al., "Analogue–Digital ASICs Circuit Techniques, Design Tools and Applications", Peter Peregrinus Ltd., London, pp. 126–127, 1991.

*Primary Examiner*—Jeffrey A. Gaffin
*Assistant Examiner*—Peguy Jean Pierre

[57] ABSTRACT

In a digital/analog (D/A) converter, a plurality of resistors are connected in series between first and second power supply voltage terminals, and a plurality of switches are arranged in a tree configuration between first nodes of the resistors and an output terminal. The switches are turned ON and OFF in response to input bits. At least one reset switch is connected to a second node of at least one of the switches on a side of said output terminal, thus resetting the second node to a predetermined voltage.

11 Claims, 13 Drawing Sheets

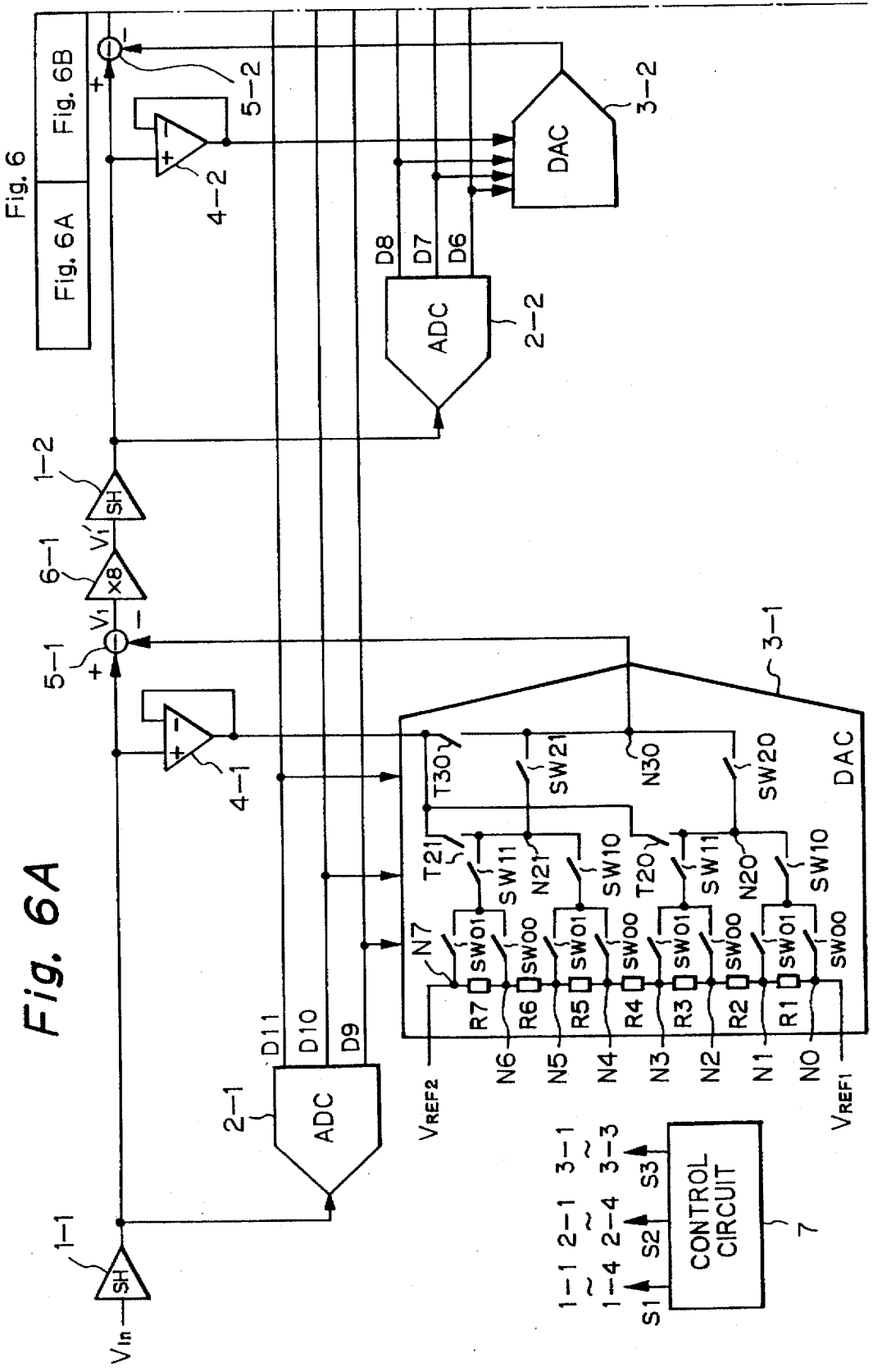

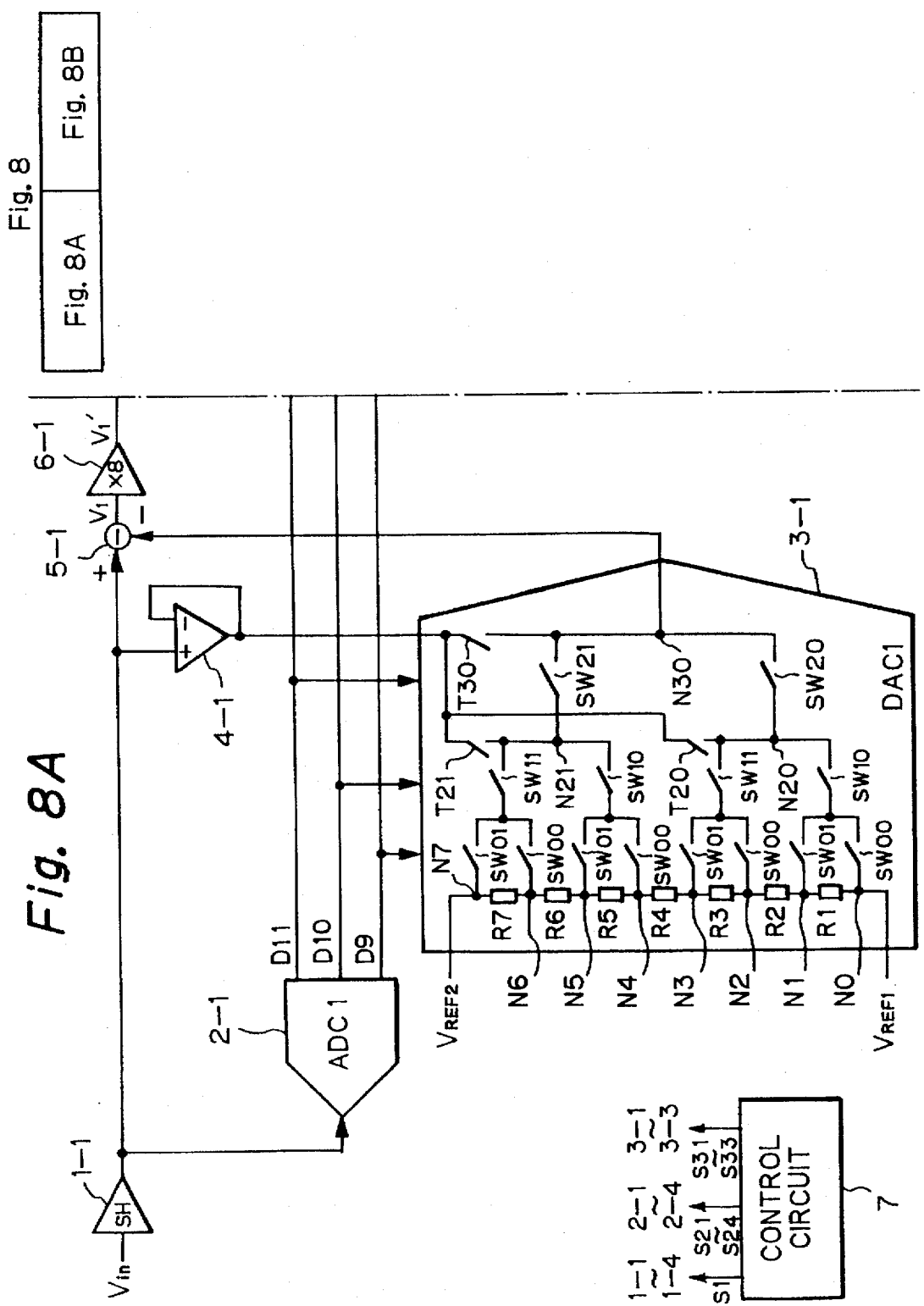

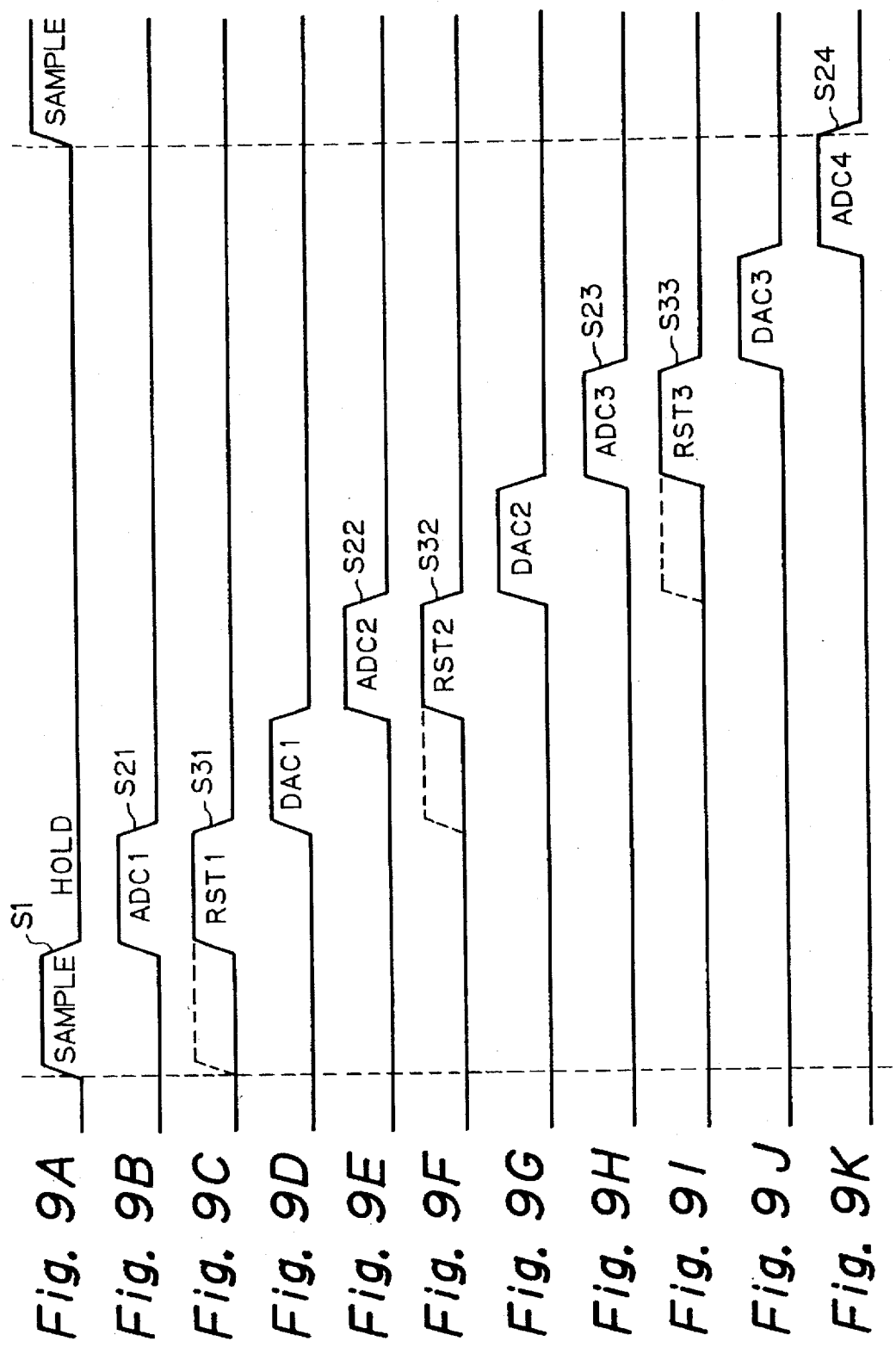

RESISTOR STRING DIGITAL/ANALOG CONVERTER WITH RESETTING SWITCHES

BACKGROUND OF THE INVENTION

1. Field of the Invention

The present invention relates to a resistor string digital/analog (D/A) converter and an analog/digital (A/D) converter apparatus including the resistor string D/A converter.

2. Description of the Related Art

Resistor string D/A converters are well known as the simplest D/A converters.

In a first prior art N-bit resistor string D/A converter, ($2^N$-1) resistors are connected in series between a low reference voltage terminal and a high reference voltage terminal. Nodes of the resistors are connected via switches to an output terminal. In this case, one of the switches is turned ON in accordance with input bits. Thus, an output voltage at the output terminal has $2^N$ values in accordance with the switches. This will be explained later in detail.

In the above-mentioned first prior art resistor string D/A converter, however, since all of the switches are connected to the output terminal, a parasitic capacitance connected to the output terminal is substantially increased, which increases a settling time period by which the output voltage reaches a stable value.

Also, when a current flowing through the resistor string is increased to reduce the settling time period, the power dissipation is increased.

In a second prior art resistor string D/A converter, a tree configuration of switches is realized to reduce the parasitic capacitance connected to the output terminal, thus reducing the settling time period (see: Malcolm R. Haskard et al., "Analog VLSI Design nMOS and CMOS", Prentice Hall of Australia Pty Ltd, pp. 115–117, 1988, & R. S. Soin et al., "Analogue-Digital ASICs Circuit Techniques, Design Tools and Applications", Peter Peregrinus Ltd., London. pp. 126–127, 1991). This will also be explained later in detail.

In the above-described second prior art resistor string D/A converter, although the number of open switches serving as parasitic capacitances connected to the output terminal is reduced, the number of closed switches in aeries connected between the resistor string and the output terminal is increased. Therefore, the settling time period is still large. Even in the above-described second prior art D/A converter, note that the settling time period is dependent upon a previous state of the switches and a current state of the switches. Therefore, the settling time period has to be set to a maximum settling time period.

Further, when a current flowing through the resistor string is increased to reduce the settling time period, the power dissipation is increased.

SUMMARY OF THE INVENTION

It is an object of the present invention to provide a resistor string D/A converter having a reduced settling time period.

Another object is to provide an A/D converter apparatus including such a resistor string D/A converter.

According to the present invention, in a D/A converter, a plurality of resistors are connected in series between first and second power supply voltage terminals, and a plurality of switches are arranged in a tree configuration between first nodes of the resistors and an output terminal. The switches are turned ON and OFF in response to input bits. At least one reset switch is connected to a second node of at least one of the switches on a side of the output terminal, thus resetting the second node to a predetermined voltage.

BRIEF DESCRIPTION OF THE DRAWINGS

The present invention will be more clearly understood from the description as set forth below, as compared with the prior art, with reference to the accompanying drawings, wherein:

FIGS. 6A and 6B are a circuit diagram illustrating a subranging type A/D converter apparatus including a third embodiment of the three-bit resistor string D/A converter according to the present invention;

FIGS. 8A and 8B are a circuit diagram illustrating a modification of the subranging type A/D converter apparatus of FIGS. 6A and 6B;

FIGS. 9A through 9K are timing diagrams showing the operation of the A/D converter apparatus of FIGS. 8A and 8B;

DESCRIPTION OF THE PREFERRED EMBODIMENTS

Before the description of the preferred embodiments, prior art resistor string D/A converters will be explained with reference to FIGS. 1 and 2.

Figure 1:
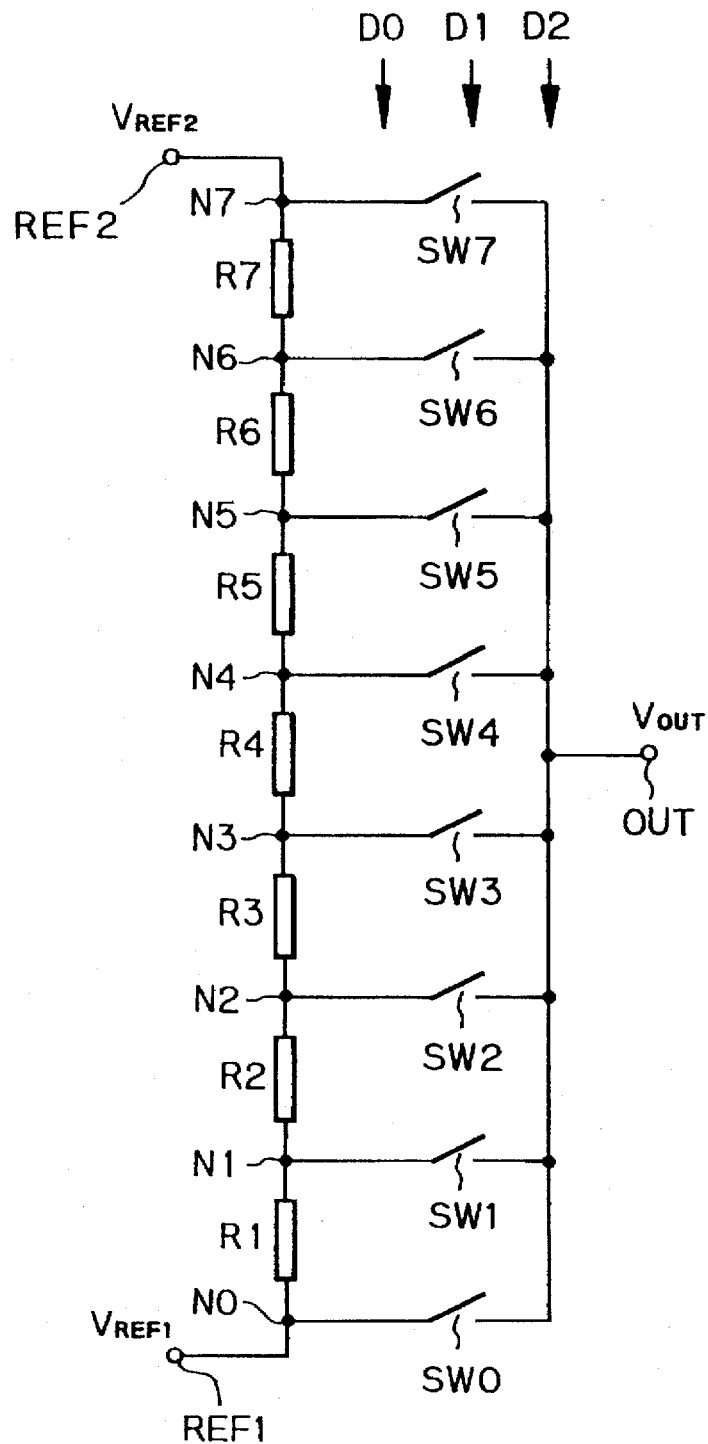
FIG. 1 is a circuit diagram illustrating a first prior art three-bit resistor string D/A converter.

In FIG. 1, which illustrates a first prior art three-bit resistor string A/D converter, ($2^3$-1) resistors R1, R2, . . . , R7 are connected in series between a low reference voltage terminal REF1 whose voltage is $V_{REF1}$ and a high reference voltage terminal REF2 whose voltage is $V_{REF2}$. Nodes N0, N1, . . . , N7 of the resistors R1, R2, . . . , R7 are connected via switches SW0, SW1, . . . , SW7 to an output terminal OUT. In this case, one of the switches SW0, SW1, . . . , SW7 is turned ON in accordance with three input bits D0, D1 and D2. For example,

| ON | D0 | D1 | D2 |
| --- | --- | --- | --- |
| SW7 | 1 | 1 | 1 |
| SW6 | 0 | 1 | 1 |
| SW5 | 1 | 0 | 1 |

-continued

| ON | D0 | D1 | D2 |
|---|---|---|---|
| SW4 | 0 | 0 | 1 |
| SW3 | 1 | 1 | 0 |
| SW2 | 0 | 1 | 0 |
| SW1 | 1 | 0 | 0 |
| SW0 | 0 | 0 | 0 |

Thus, an output voltage $V_{OUT}$ at the output terminal OUT has eight values in accordance with the switches SW0, SW1, ..., SW7.

In the resistor string D/A converter of FIG. 1, however, since all of the switches SW0, SW1, ..., SW7 are connected to the output terminal OUT, a parasitic capacitance connected to the output terminal OUT is substantially increased, which increases a settling time period by which the output voltage $V_{OUT}$ reaches a stable value.

Generally, if the number of input bits is N, the number of the switches is $2^N$. Therefore, when the resolution of the D/A converter is increased, i.e., when the number of in D/A bits of the D/A converter is increased, the parasitic capacitance of the output terminal is further increased, so that the settling time period is farther increased.

Note that the settling time period is dependent upon a previous state of the switches SW0 through SW7 and a current state of the switches SW0 through SW7. Therefore, the settling time period has to be set to a maximum settling time period for transiting from a state where only the switch SW0 is turned ON to a state where only the switch SW7 is turned ON.

Also, in FIG. 1, when a current flowing through the resistor string is increased to reduce the settling time period, the power dissipation is increased.

Figure 2:
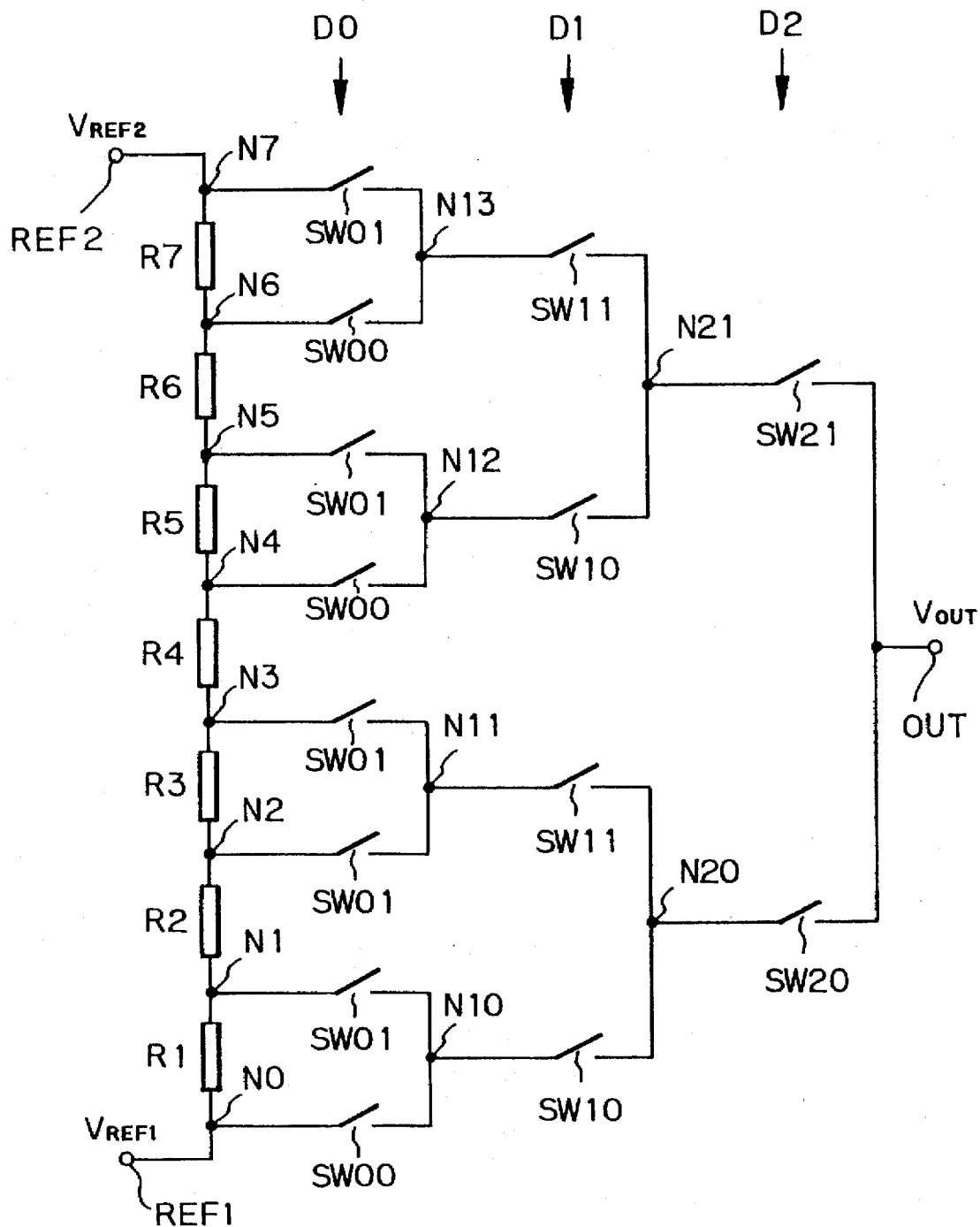
FIG. 2 is a circuit diagram illustrating a second prior art three-bit resistor string D/A converter.

In FIG. 2, which illustrates a second prior art three-bit resistor string D/A converter, a tree configuration of switches is realized to reduce the parasitic capacitance connected to the output terminal OUT, thus reducing the settling time period. That is, four pairs of switches SW00 and SW01 operated in response to the input bit D0 are connected between the nodes N0 through N7 and four nodes N10, N11, N12 and N13. Also, two pairs of switches SW10 and SW11 operated in response to the input bit D1 are connected between the nodes N10 through N13 and two nodes N20 and N21. Further, a pair of switches SW20 and SW21 operated in response to the input bit D2 are connected between the nodes N20 and N21 and the output terminal OUT (see: Malcolm R. Haskard et al., "Analog VLSI Design nMOS and CMOS", Prentice Hall of Australia Pty Ltd, pp. 115–117, 1988, & R. S. Soin et al., "Analogue-Digital ASICs Circuit Techniques, Design Tools and Applications", Peter Peregrinus Ltd,. London, pp. 126–127, 1991). In this case, when the input bit D0 is "0", the switches SW00 are turned ON, while when the input bit D0 is "1", the switches SW01 are turned ON, Also, when the input bit D1 is "0", the switches SW10 are turned ON, while when the input bit D1 is "1", the switches SW11 are turned ON. Further, when the input bit D2 is "0", the switches SW20 are turned ON, while when the input bit D2 is "1", the switches SW21 are turned ON.

In the resistor string D/A converter of FIG. 2, although the number of open switches serving as parasitic capacitances connected to the output terminal OUT is reduced, the number of closed switches in series connected between the resistor string and the output terminal OUT is increased. In FIG. 2, the number of such closed switches is 3. Therefore, the settling time period is still large.

Even in FIG. 2, note that the settling time period is dependent upon a previous state of the switches SW00, SW01, SW11, SW20 and SW21 and a current state of the switches SW00, SW01, SW11, SW20 and SW21. Therefore, the settling time period has to be set to a maximum settling time. Here, assume that $V_{REF1}=0V$ and $V_{REF2}=8V$, and R1=R2=...=R7, then, the voltages at nodes N0, N1, ..., N7 are 0V, 1V, ..., 7V, respectively. For example, consider a transition from a previous state when (D0, D2, D2)=(0, 1, 1) to a current state where (D0, D1, D2)=(1, 0, 0). In the previous state, the voltages at the nodes N10, N20 and N30 are 0V, 2V and 6V, respectively. On the other hand, in the current state, the voltages at the nodes N10, N20 and N30 are 1V, 1V and 5V. Therefore, when the previous state is transferred to the current state, the differences in potential at the nodes N10, N20 and N30 are 1V, 1V and 5V. In this case, the settling time period is proportional to $$7V (=1V+1V+5V) \qquad (1)$$

Also, in FIG. 2, when a current flowing through the resistor string is increased to reduce the settling time period, the power dissipation is increased.

Figure 3:
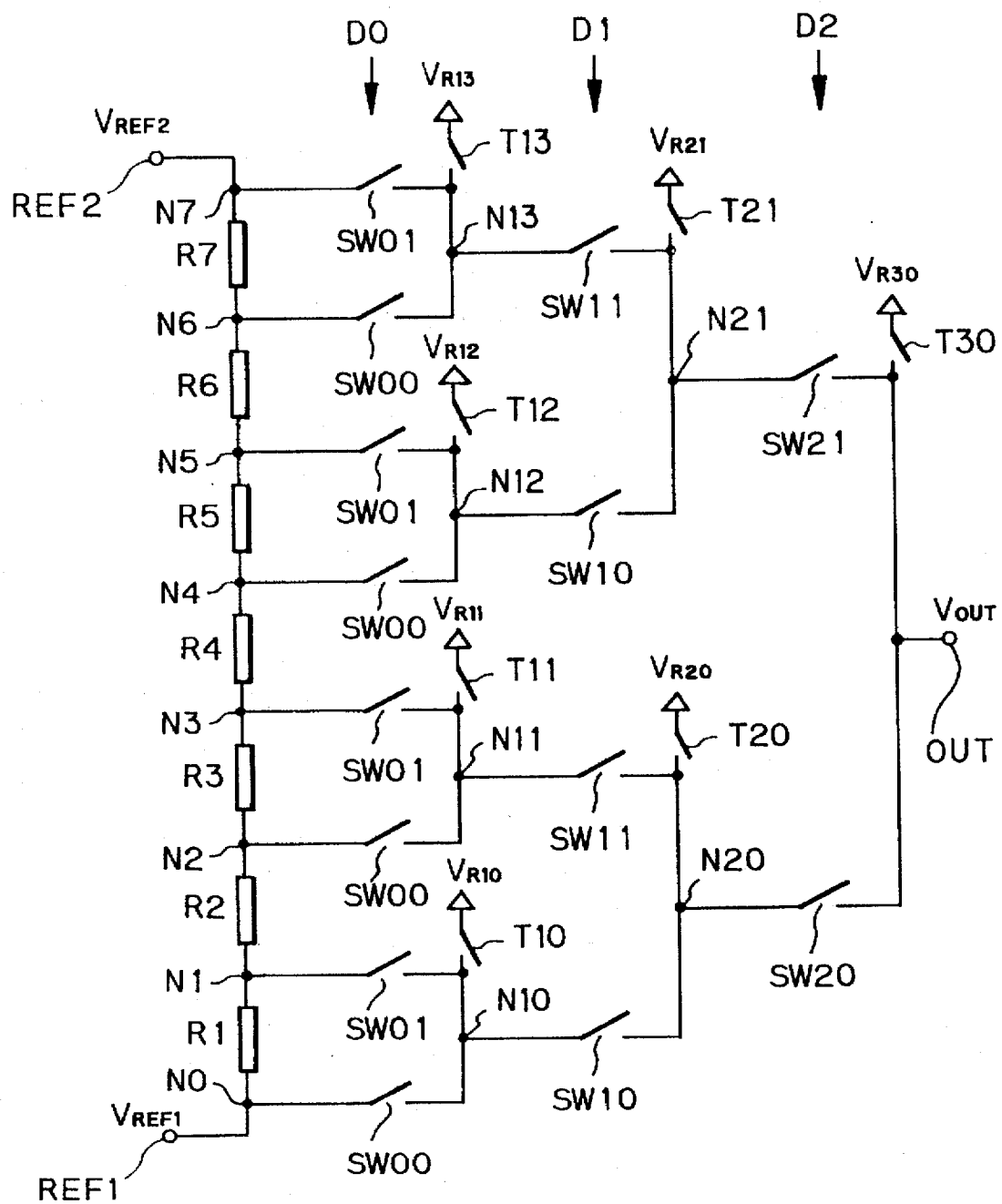
FIG. 3 is a circuit diagram illustrating a first embodiment of the three-bit resistor string D/A converter according to the present invention.

In FIG. 3, which illustrates a first embodiment of the present invention, reset switches T10, T11, T12, T13, T20, T21 and T30 are connected to the nodes N10, N11, N12, N13, N20, N21 and the output terminal OUT, respectively, of FIG. 2, for resetting the nodes N10, N11, N12, N13, N20, N21 and the output terminal OUT to reset voltage $V_{R10}$, $V_{R11}$, $V_{R12}$, $V_{R13}$, $V_{R20}$, $V_{R21}$ and $V_{R30}$, respectively.

Note that the reset switches T10, T11, T12, T13, T20, T21 and T30 can be reduced in size compared with the switches SW00, SW01, SW10, SW11, SW20 and SW21. Therefore, an increased parasitic capacitance connected to the output terminal OUT can be neglected.

In FIG. 3, during a reset time period before the three input bits D0, D1 and D2 are supplied to the switches SW00, SW01, SW10, SW11, SW20 and SW21, the reset switches T10, T11, T12, T13, T20, T21 and T30 are turned ON. Thus, such a reset time period is required in addition to a settling time period for obtaining a stable value at the output terminal OUT. However, if such a reset time period is provided in a non D/A conversion time period, the reset time period can be neglected.

In FIG. 3, the settling time period is dependent not upon a previous state of the switches and a current state of the switches, but upon the reset voltages and the current state of the switches. Therefore, if the reset voltages are appropriate, a maximum settling time period can be reduced.

Note that the reset voltages $V_{R10}$, $V_{R11}$, $V_{R12}$, $V_{R13}$, $V_{R20}$, $V_{R21}$ and $V_{R30}$ can be the same.

Also, in FIG. 3, the reset switches are provided for all the nodes N10, N11, N12, N13, N20 N21, and N30; however, the reset switches can be provided for a part of the nodes N10, N11, N12, N13, N20, N21 and N30. For example, as illustrated in FIG. 4, the reset switches T20, T21 and T30 are provided only for the nodes N20, N21 and N30 which are near the output terminal OUT and therefore have large voltage changes.

Figure 5:
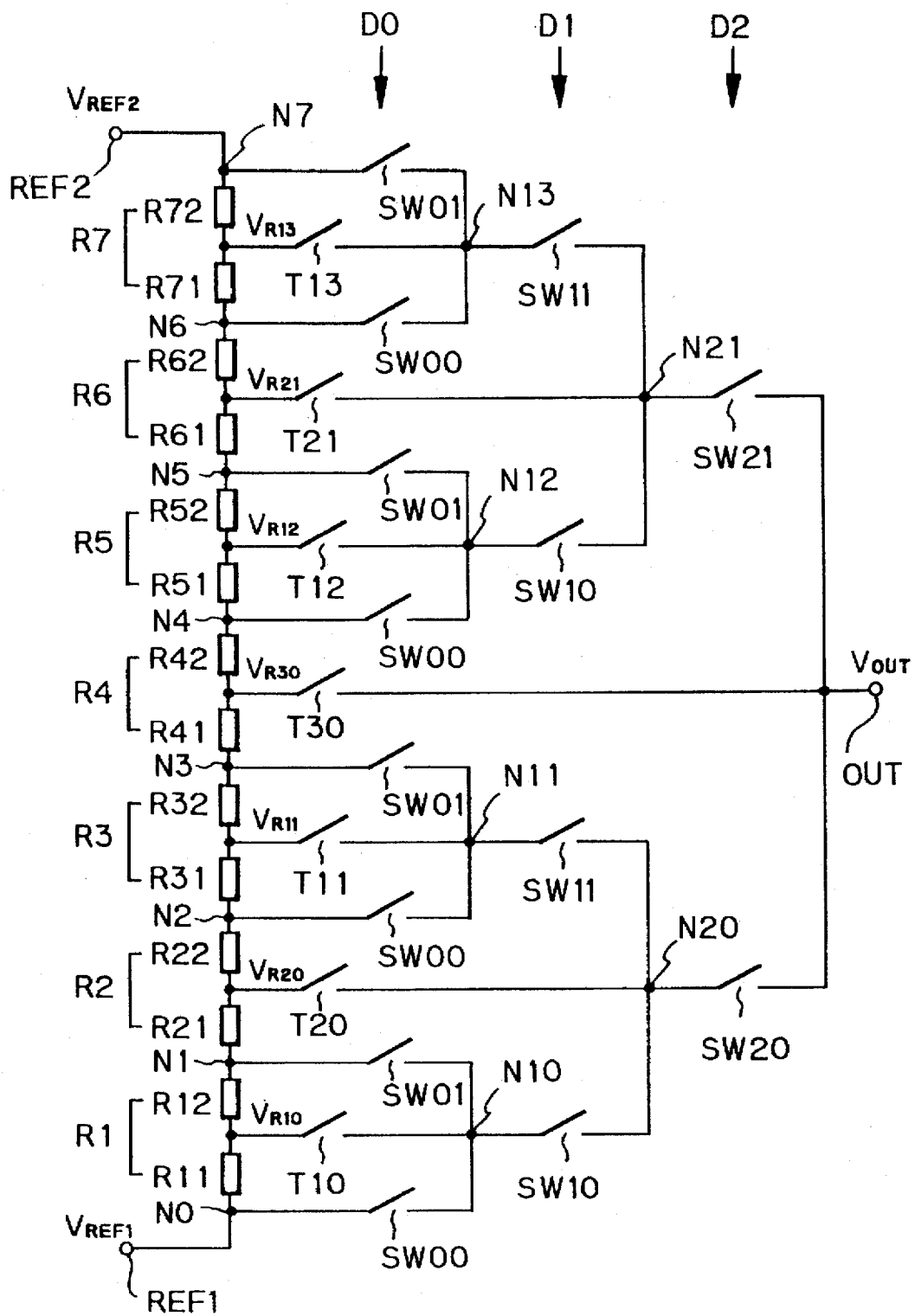
FIG. 5 is a circuit diagram illustrating a second embodiment of the three-bit resistor string D/A converter according to the present invention.

In FIG. 5, which illustrates a second embodiment of the present invention, each resistor Ri (i=1~7) of FIG. 3 is divided into two serially-connected resisters Ri1 and Ri2 having the same resistance value. The reset switches T10, T11, T12, T13 are connected between the resisters R11 and R12, between the resisters R31 and R32, between the resisters R51 and R52, and between the resisters R71 and R72. Therefore, $V_{R10}=0.5$ V $V_{R11}=2.5$ V $V_{R12} = 4.5 V$ $V_{13} = 6.5 V$ Also, the reset switches T20 and T21 are connected between the resisters R21 and R22 and between the resisters R61 and R62. Therefore, $V_{R20} = 1.5 V$ $V_{R21} = 5.5 V$ Further, the reset switch T30 is connected between the resisters R41 and R42. Therefore, $V_{R30} = 4.5 V$ For example, consider a transition from a reset state when all the reset switches T10, T11, T12, T13, T20, T21 and T30 are turned ON to a current state where (D0, D1, D2)=(1, 0, 0). In the reset state, the voltages at the nodes N10, N20 and N30 are 0.5V, 2.5V and 4.5V, respectively. On the other hand, in the current state, the voltages at the nodes N10, N20 and N30 are 1V, 1V and 5V. Therefore, when the reset state is transferred to the current state, the differences in potential at the nodes N10, N20 and N30 are 0.5V, 1.5V and 3.5V, respectively. In this case, the settling time period is proportional to $$5.5V (=0.5V + 1.5V + 3.5V) \qquad (2)$$

Thus, the settling time period can be reduced compared with the D/A converter of FIG. 3 (see the equation (1)).

Figure 4:
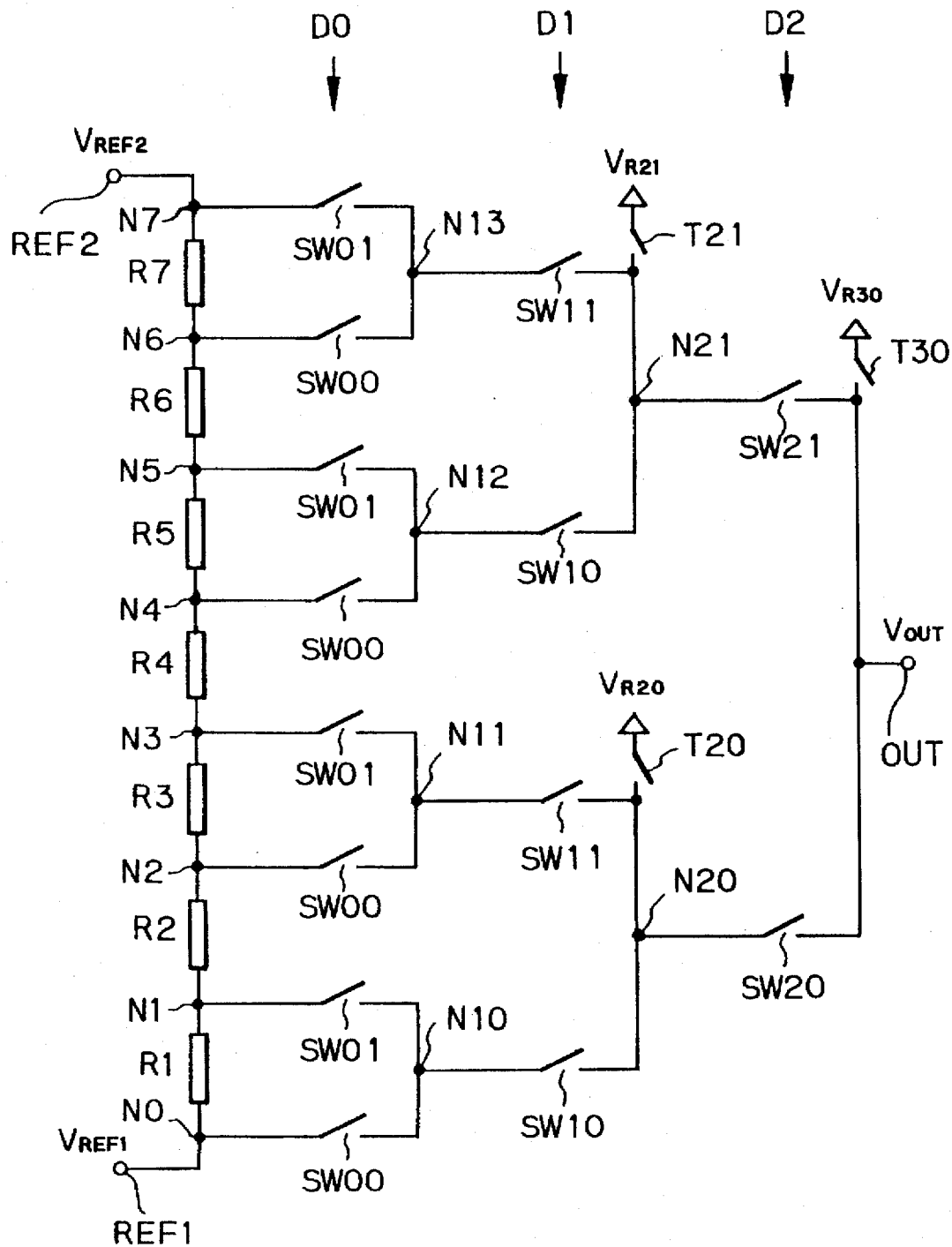
FIG. 4 is a circuit diagram illustrating a modification of the D/A converter of FIG. 3.

In FIGS. 3, 4 and 5, if the number of input bits is more than 3, the number of switches connected in series between the resistor string and the output terminal OUT is 3, so that the ON resistance of the switches and the parasitic capacitance connected to the output terminal OUT are increased. However, even in this case, the settling time period can he remarkably reduced by the present invention.

Also, in FIGS. 3, 4 and 5, an amplifier such as a voltage follower can be connected to the output terminal OUT to increase the driving power for loads connected to the output terminal OUT.

Figure 6B:
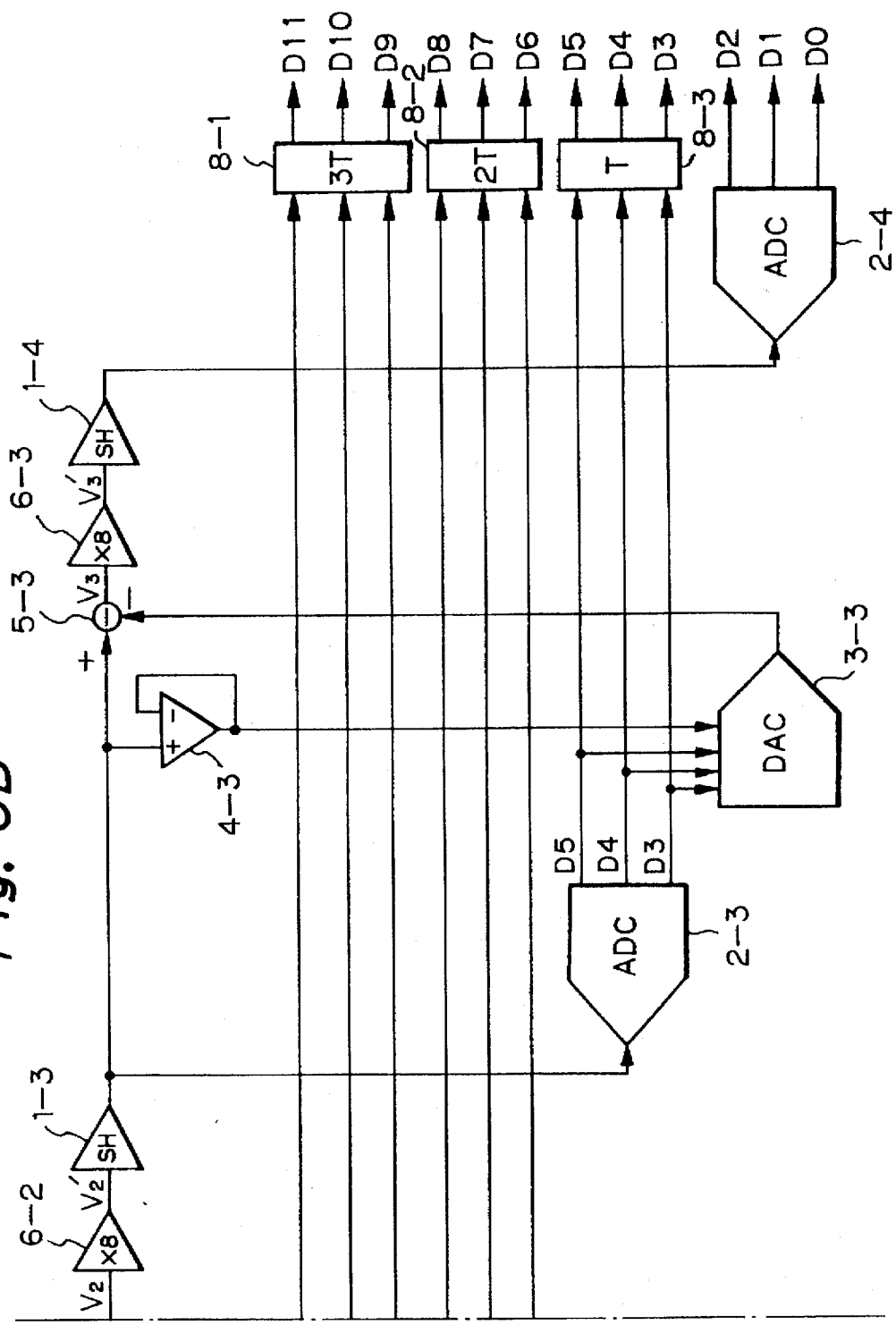

In FIGS. 6A and 6B, which illustrate a four-step 12-bit A/D converter apparatus including a third embodiment of the three-bit resistor string D/A converter according to the present invention, sample/hold circuits 1-1, 1-2, 1-3, and 1-4, three-bib A/D converters 2-1, 2-2, 2-3 and 2-4, three-bit D/A converters 3-1, 3-2 and 3-3 which have a similar configuration to the D/A converter of FIG. 4, voltage followers 4-1, 4-2 and 4-3, substractors 5-1, 5-2 and 5-3, and ×8 multipliers 6-1, 6-2 and 6-3 are provided. In this case, the A/D converters 2-1, 2-2, 2-3 and 2-4 have the same configuration, that is, seven comparison reference voltages are commonly applied to the A/D converters 2-1, 2-2, 2-3 and 2-4. Also, the D/A converters 3-1, 3-2 and 3-3 have the same configuration due to the presence of the ×8 multipliers. The sample/hold circuits 1-1 to 1-4, the A/D converters 2-1 to 2-4, and the D/A converters 3-1 to 3-3 are controlled by a control circuit 7.

That is, in a first step, an A/D conversion is performed by the A/D converter 2-1 upon an analog input voltage $V_{in}$ to obtain bits D11, D10 and D9.

In a second step, an A/D conversion is performed by the A/D converter 2-2 upon a difference $V_1$ between the analog input voltage $V_{in}$ and an analog voltage determined by the bits D11, D10 and D9, thus obtaining bits D8, D7 and D6. Actually, in this case, note that the difference $V_1$ is converted by the ×8 multiplier 6-1 into a voltage $V_1'$ having the same range as the analog input voltage $V_{in}$.

In a third step, an A/D conversion is performed by the A/D converter 2-3 upon a difference $V_2$ between the voltage $V_1'$ and an analog voltage determined by the bits D8, D7 and D6, thus obtaining bits D5, D4 and D3. Actually, in this case, note that the difference $V_2$ is converted by the ×8 multiplier 6-2 into a voltage $V_2'$ having the same range as the analog input voltage $V_{in}$.

In a fourth step, an A/D conversion is performed by the A/D converter 2-4 upon a difference $V_3$ between the voltage $V_2'$ and an analog voltage determined by the bits D5, D4 and D3, thus obtaining kits D2, D1 and D0. Actually, in this case, note that the difference $V_3$ is converted by the ×8 multiplier 6-3 into a voltage $V_3'$ having the same range as the analog input voltage $V_{in}$.

Thus, the twelve bits D11, D10, ..., D0 are obtained.

The operation of the 12-bit A/D converter apparatus of FIGS. 6A and 6B is explained next with reference to FIGS. 7A, 7B, 7C and 7D.

Figures 7A, 7B, 7C, 7D:
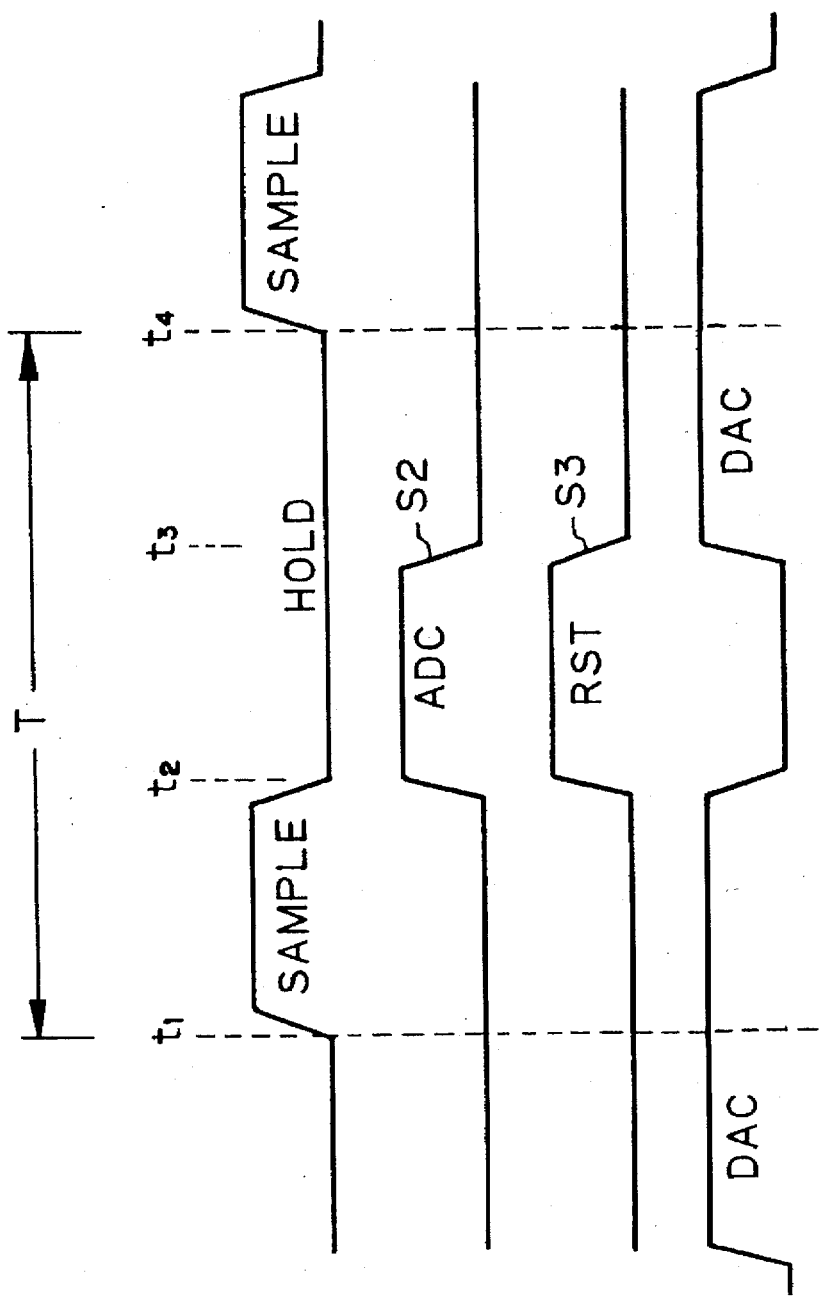
FIGS. 7A through 7D are timing diagrams showing the operation of the A/D converter apparatus of FIGS. 6A and 6B.

At time $t_1$, the control circuit 7 generates a sample/hole signal S1 as shown in FIG. 7A and transmits it to the sample/hold circuits 1-1 to 1-4, so that the sample/hold circuits 1-1 to 1-4 enter a sampling operation mode. Next, at time $t_2$, the signal S1 is deactivated so that the sample/hold circuits 1-1 to 1-4 enter a holding operation mode. Simultaneously, the control circuit 7 generates an A/D conversion command signal S2 as shown in FIG. 7B and transmits it to the A/D converters 2-1, 2-2 and 2-3, so that the A/D converters 2-1, 2-2 and 2-3 perform A/D conversions upon their input voltages. Further, the control circuit 7 generates a reset signal S3 as shown in FIG. 7C and transmits it to the D/A converters 3-1 to 3-3. Thus, the nodes N20, N21 and N30 within the D/A converters 3-1 to 3-3 are reset to their input voltages, respectively.

Next, at time $t_3$, the A/D conversion command signal S2 is deactivated, and accordingly, the bits D11, D10, D9 of the A/D converter 2-1, the bits D5, D7 and D6 of the A/D converter 2-2, the bits D5, D4 and D3 of the A/D converters 2-3, and the bits D2, D1 end D0 of the A/D converter 2-4 are determined. Simultaneously, the reset signal S3 is deactivated.

As a result, as shown in FIG. 7D, the D/A converters 3-1, 3-2 and 3-3 are operated in response to the outputs of the A/D converters 2-1, 2-2 and 2-3, respectively. At time $t_4$, the sample/hold circuits 1-1 to 1-4 enter a sampling operation mode, while the D/A converters 3-1 to 3-3 continues D/A conversions. Therefore, the sample/hold circuits 1-1 to 1-4 always sample update data.

In the A/D converter apparatus of FIGS. 6A and 6B, since each step is pipelined, the bits D11, D10 and D9 are delayed by three time periods 3T by a delay circuit 8-1, the bits D8, D7 and D6 are delayed by two time periods 2T by a delay circuit 8-2, and the bits D5, D4 end D3 are delayed by one time period 1T by a delay circuit 8-3. Note that the time period T is shown in FIGS. 7A through 7D.

Figure 8B:
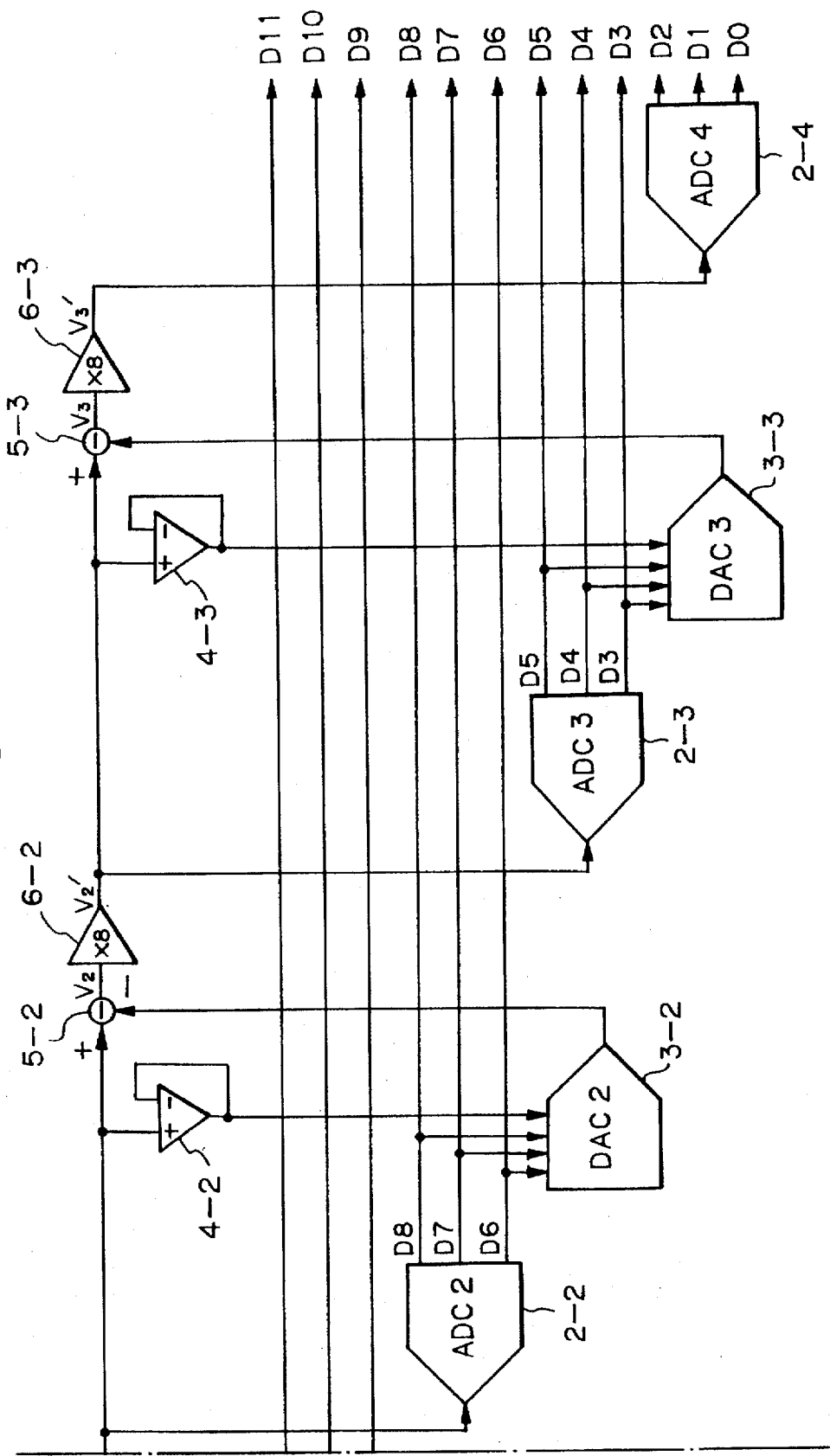

In FIGS. 8A and 8B, which illustrate a modification of the A/D converter apparatus of FIGS. 6A and 6B, a pipelined architecture is not adopted. That is, the sample/hold circuits 1-2, 1-3 and 1-4 of FIGS. 6A and 6B are not provided, and accordingly, the A/D converters 2-1, 2-2, 2-3 and 2-4 operate for the same analog input voltage $V_{in}$ held in the sample/hold circuit 1-1. Also, the delay circuits 8-1, 8-2 and 8-3 of FIGS. 6A and 6B are not provided.

In FIGS. 8A and 8B, since each step is sequentially carried out, the control circuit 7 generates individual A/D conversion command signals S21, S22, S23 and S24 and transmits them to the A/D converters 2-1, 2-2, 2-3 and 2-4, respectively. Also, the control circuit 7 generates individual reset signals S31, S32 and S33 and transmits them to the D/A converters 3-1, 3-2 and 3-3, respectively. The operation of the A/D converter apparatus of FIGS. 8A and 8B is shown in FIGS. 9A through 9K.

In the A/D converter apparatuses of FIGS. 6A and 6B and FIGS. 8A and 8B, since resetting operations for resetting the nodes within the D/A converters 3-1, 3-2 and 3-3 are carried out before the operation of the D/A converters 3-1, 3-2 and 3-3, such resetting operations do not affect the settling time periods of the D/A converters 3-1, 3-2 and 3-3, and accordingly, do not affect the settling time of the A/D converter apparatuses of FIGS. 6A and 6B and FIGS. 8A and 8B.

Also, in the A/D converter apparatuses of FIGS. 6A and 6B and FIGS. 8A and 8B, the nodes within the D/A converters 3-1, 3-2 and 3-3 are reset to voltages $V_{in}$, $V_1'$ and $V_2'$, respectively, which are close to expected values of the D/A converters 3-1, 3-2 and 3-3, respectively. Therefore, the settling time period of each of the D/A converters 3-1, 3-2 and 3-3, and accordingly, the settling time period of the A/D converter apparatuses of FIGS. 6A and 6B and FIGS. 8A and 8B can be reduced.

Figure 10:
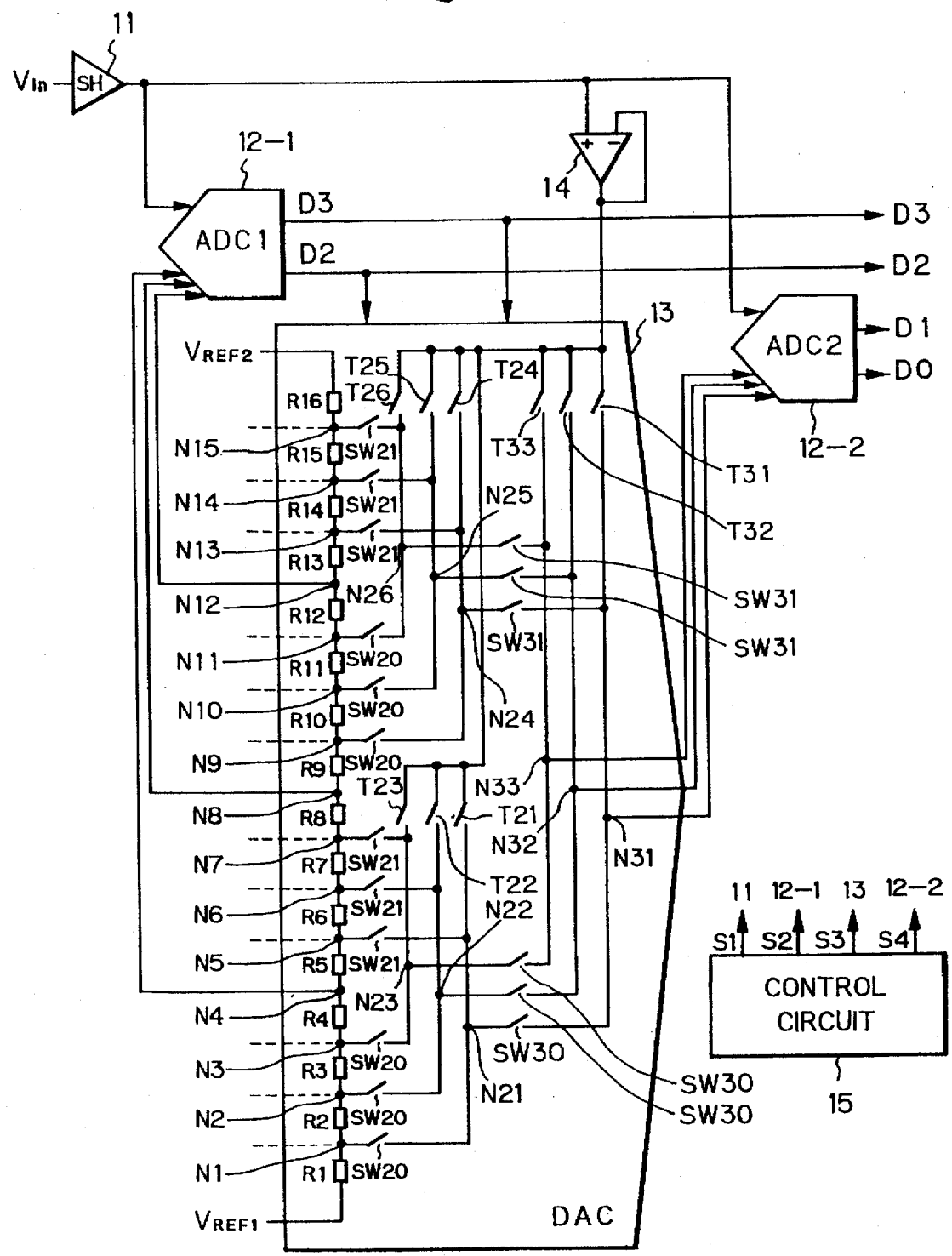
FIG. 10 is a circuit diagram illustrating a subranging type A/D converter apparatus including a fourth embodiment of the two-bit three-output resistor string D/A convertor according to the present invention.

In FIG. 10, which illustrates a two-step 4-bit A/D converter apparatus including a fourth embodiment of the three-bit resistor string D/A converter according to the present invention, a sample/hold circuit 11, two-bit A/D converters 12-1 and 12-2, a two-bit three-output D/A converter 13, a voltage follower 14, and a control circuit 15 are provided.

The A/D converter 12-1 generates two bits D3 and D2, and the A/D converter 12-2 generates two bits D1 and D0.

The D/A converter 13 applies fixed comparison reference voltages $V_{r4}$, $V_{r8}$ and $V_{r12}$ to the A/D converter 12-1. In this case, $$V_{REF1} < V_{r4} < V_{r8} < V_{r12} < V_{REF2}$$

On the other hand, the D/A converter 13 applies reference comparison voltages to the A/D converter 12-2 in accordance with the bits D3 and D2 of the A/D converter 12-1. That is, if (D3, D2)=(0, 0), the D/A converter 13 applies $V_{r1}$, $V_{r2}$ and $V_{r3}$ to the A/D converter 12-2. In this case, $$V_{REF1} < V_{r1} < V_{r2} < V_{r3} < V_{r4}$$

Also, if (D3, D2)=(0, 1), the D/A converter 13 applies $V_{r5}$, $V_{r6}$ and $V_{r7}$ to the A/D converter 12-2. In this case, $$V_{r4} < V_{r5} < V_{r6} < V_{r7} < V_{r8}$$

Further, if (D3, D2)=(1, 0), the D/A converter 13 applies $V_{r9}$, $V_{r10}$ and $V_{r11}$ to the A/D conveyer 12-2. In this case, $$V_{r8} < V_{r9} < V_{r10} < V_{r11} < V_{r12}$$

In addition, if (D3, D2)=(1, 1), the D/A conveyer 13 applies $V_{r12}$, $V_{r13}$ and $V_{r14}$ to the A/D converter 12-2, In this case, $$V_{r12} < V_{r13} < V_{r14} < V_{r15} < V_{REF2}$$

The D/A converter 13 is formed by a resistor string including resistors R1, R2, ..., R16 to which reference voltages $V_{REF1}$ and $V_{REF2}$ are applied. Nodes N1, N2, ..., N15 between the resistors R1, R2, ..., R16 generate the voltages $V_{r1}$, $V_{r2}$, ..., $V_{r15}$, respectively. The nodes N1, N2 and N3 are connected by switches SW20 to nodes N21, N22 and N23, respectively, and the nodes N5, N6 and N7 are connected by switches SW21 to the nodes N21, N22 and N23, respectively. The nodes N21, N22 and N23 are connected by switches SW30 to nodes N31, N32 and N33, respectively. On the other hand, the nodes N9, N10 and N11 are connected by switches SW20 to nodes N24, N25 and N26, respectively, and the nodes N13, N14 and N15 are connected by switches SW21 to the nodes N24, N25 and N26, respectively. The nodes N24, N25 and N26 are connected by switches SW31 to the nodes N31, N32 and N33, respectively.

When D2=0, the switches SW20 are turned ON, while when D2=1, the switches SW21 are turned ON. Also, when D3=0, the switches SW30 are turned ON, while when D3=1, the switches SW31 are turned ON. Thus, the voltages $V_{r1}$, $V_{r2}$ and $V_{r3}$, the voltages $V_{r5}$, $V_{r6}$ and $V_{r7}$, the voltages $V_{r9}$, $V_{r10}$ and $V_{r11}$, and the voltages $V_{r13}$, $V_{r14}$ and $V_{r15}$ are selected and applied to the A/D converter 12-2.

Also, the nodes N21, N22, N23, N24, N25, N26, N31, N32 and N33 are connected via reset switches T21, T22, T23, T24, T25, T26, T31, T32 and T33, respectively, to the voltage buffer 14. As a result, when all the reset switches are turned ON while the switches SW20, SW21, SW30 and SW31 are turned OFF, the nodes N21, N22, N23, N24, N25, N26, N31, N32 and N33 are reset to the analog input voltage $V_{in}$.

The operation of the 4-bit A/D converter apparatus of FIG. 10 is explained next with reference to FIGS. 11A, 11B, 11C and 11D.

Figures 11A, 11B, 11C, 11D, 11E:
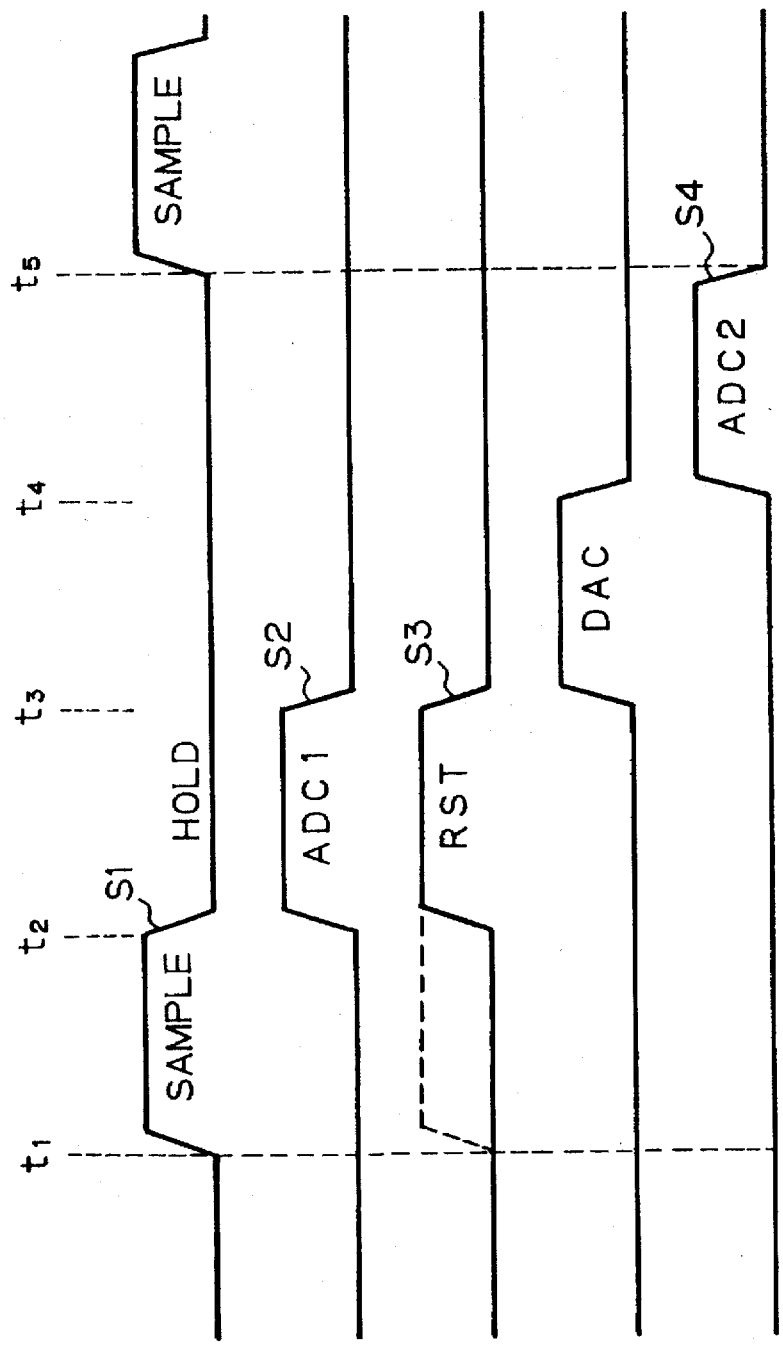
FIGS. 11A through 11E are timing diagrams showing the operation of the A/D converter apparatus of FIG. 10.

At time $t_1$, the control circuit 15 generates a sample/hole signal S1 as shown in FIG. 11A and transmits it to the sample/hold circuit 11, so that the sample/hold circuit 11 enters a sampling operation mode.

Next, at time $t_2$, the signal S1 is deactivated, so that the sample/hold circuit 11 enters a holding operation mode. Simultaneously, the control circuit 15 generates an A/D conversion command signal S2 as shown in FIG. 11B and transmits it to the A/D converter 12-1, so that the A/D converter 12-1, performs an A/D conversion upon the analog input voltage $V_{in}$. Further, the control circuit 15 generates a reset signal S3 as shown in FIG. 11C and transmits it to the D/A converter 13. Thus, the nodes N21 through N26 and N31 through N23 within the D/A converter 13 are reset to the analog input voltage $V_{in}$. In this case, the reset signal S3 can be generated at time $t_1$.

Next, at time $t_3$, the A/D conversion command signal S2 is deactivated, and accordingly, the bits D3 and D2 of the A/D converter 2-1 are determined. Simultaneously, the reset signal S3 is deactivated.

As a result, as shown in FIG. 11D, the D/A converter 13 are operated in response to the outputs of the A/D converter 12-1.

Next, at time $t_4$, the control circuit 15 generates an A/D conversion command signal S4 as shown in FIG. 11E and transmits it to the A/D converter 12-2, so that the A/D converter 12-2 performs an A/D conversion upon the analog input voltage $V_{in}$.

Finally, at time $t_5$, the A/D conversion command signal S4 is deactivated, and accordingly, the bits D1 and D0 of the A/D converter 12-2 are determined.

In the A/D converter apparatuses of FIG. 10, since a resetting operation for resetting the nodes within the D/A converter 13 is carried out before the operation of the D/A converter 13, such a resetting operation does not affect the settling time period of the D/A converter 13, and accordingly, does not affect the settling time of the A/D converter apparatus of FIG. 10.

Also, in the A/D converter apparatus of FIG. 10, the nodes within the D/A converter 13 are reset to the analog input voltage $V_{in}$. Therefore, the settling time period of the D/A converter 13, and accordingly, the settling time period of the A/D converter apparatus of FIG. 10 can be reduced.

As explained hereinabove, accordingly to the present invention, since the nodes with the resistor string D/A converter are reset, the settling time period of the resistor string D/A converter can be reduced without increasing the power dissipation. Also, in an A/D converter apparatus including the resistor string D/A converter according to the present invention, since the settling time period of the resistor string D/A converter is reduced, the conversion speed of the apparatus can be increased.

I claim:

1. A digital/analog (D/A) converter comprising:
   first and second power supply voltage means;
   an output terminal;
   a plurality of resistors connected in series between said first and second power supply voltage means;
   a plurality of switches arranged in a tree configuration between first nodes of said resistors and said output terminal, said switches being turned ON and OFF in response to input bits; and
   at least one reset switch, connected to a second node of at least one of said switches on a side of said output terminal, for resetting said second node to a predetermined voltage.

2. The D/A converter as set forth in claim 1, wherein said reset switch is connected to one of the first nodes of said resistors, for resetting said second node to a voltage at said one of the first nodes of said resistors.

3. A digital/analog (D/A) converter comprising:
   first and second power supply voltage means;
   an output terminal;
   a plurality of first resistors connected in series between, said first and second power supply voltage means, each of said first resistors including a pair of second resistors in series;
   a plurality of switches arranged in a tree configuration between first nodes of said first resistors and said output terminal, said switches being turned ON and OFF in response to input bits; and
   a plurality of reset switches, each connected between one second node of said pair of second resistors and one node of one of said switches on a side of said output terminal.

4. An analog/digital (A/D) converter apparatus comprising:
   at least first and second A/D converters, said first A/D converter performing an A/D conversion upon an analog input voltage; and
   at least one digital/analog (D/A) converter, connected to said first A/D converter, for performing a D/A conversion upon output bits of said first A/D converter,
   said second A/D converter performing an A/D conversion upon a difference between said analog input voltage and an analog output voltage of said D/A converter,
   said D/A converter comprising:
   first and second power supply voltage means;
   an output terminal;
   a plurality of resistors connected in series between said first and second power supply voltage means;
   a plurality of switches arranged in a tree configuration between first nodes of said resistors and said output terminal, said switches being turned ON and OFF in response to the output bits of said first A/D converter; and
   at least one reset switch, connected to a second node of at least one of said switches on a side of said output terminal, for resetting said second node to a predetermined voltage.

5. The A/D converter apparatus as set forth in claim 4, wherein said reset switch is connected operatively to an input of said first A/D converter, for resetting said second node to said analog input voltage.

6. The A/D converter apparatus as set forth in claim 4, wherein said reset switch is tuned ON before said D/A converter performs said D/A conversion upon the output bits of said first A/D converter.

7. The A/D converter as set forth in claim 4, further comprising at least first and second sample/hold circuits each connected to inputs of said first and second A/D converters, respectively, said first and second A/D converters being pipelined.

8. The A/D converter as set forth in claim 4, further comprising a sample/hold circuit connected to an input of said first A/D converter, said first and second A/D converters being not pipelined.

9. An analog/digital (A/D) converter apparatus comprising:
   first and second A/D converters for performing A/D conversions upon an analog input voltage; and
   a digital/analog (D/A) converter, connected to said first and second A/D converters, for applying first and second comparison reference voltages to said first and second A/D converters, respectively,
   said D/A converter comprising:
   first and second power supply voltage means;
   a plurality of output terminals for generating said second comparison reference voltages;
   a plurality of first resistors, connected in series between said first and second power supply voltage means, for generating said first comparison reference voltages, each of said first resistors including a plurality of second resistors in series;
   a plurality of switches arranged in a tree configuration between first nodes of said second resistors and said output terminals, said switches being turned ON and OFF in response to output bits of said first A/D converter; and
   a plurality of reset switches, each connected to one second node of one of said switches on a side of said output terminals.

10. The A/D converter apparatus as set forth in claim 9, wherein said reset switches are connected operatively to inputs of said first and second A/D converters for resetting said second node to said analog input voltage.

11. The A/D converter apparatus as set forth in claim 9, wherein said reset switches are turned ON before said D/A converter is operated.

* * * * *